United States Patent
Yamaguchi et al.

(10) Patent No.: US 9,658,063 B2
(45) Date of Patent: May 23, 2017

(54) METHOD AND DEVICE FOR LINE PATTERN SHAPE EVALUATION

(71) Applicant: HITACHI HIGH-TECHNOLOGIES CORPORATION, Minato-ku, Tokyo (JP)

(72) Inventors: Atsuko Yamaguchi, Tokyo (JP); Hiroki Kawada, Tokyo (JP)

(73) Assignee: Hitachi High-Technologies Corporation, Tokyo (JP)

(*) Notice: Subject to any disclaimer, the term of this patent is extended or adjusted under 35 U.S.C. 154(b) by 0 days.

(21) Appl. No.: 14/897,609

(22) PCT Filed: May 27, 2014

(86) PCT No.: PCT/JP2014/064006
§ 371 (c)(1),
(2) Date: Dec. 10, 2015

(87) PCT Pub. No.: WO2014/199820
PCT Pub. Date: Dec. 18, 2014

(65) Prior Publication Data
US 2016/0123726 A1    May 5, 2016

(30) Foreign Application Priority Data
Jun. 11, 2013 (JP) .................................. 2013-122614

(51) Int. Cl.
*G01B 15/04* (2006.01)
*H01J 37/22* (2006.01)

(52) U.S. Cl.
CPC ............ *G01B 15/04* (2013.01); *H01J 37/222* (2013.01); *G01B 2210/56* (2013.01);
(Continued)

(58) Field of Classification Search
None
See application file for complete search history.

(56) References Cited

U.S. PATENT DOCUMENTS

| 7,053,371 B2* | 5/2006 | Ojima ................ G01N 23/2251 |
|---|---|---|
| | | 250/307 |
| 7,095,884 B2* | 8/2006 | Yamaguchi ...... G01N 21/95684 |
| | | 250/559.36 |

(Continued)

FOREIGN PATENT DOCUMENTS

JP    2003-037139 A    2/2003

OTHER PUBLICATIONS

Someya, Y. et al.; "Spin-on Carbon-Hardmask with high wiggling resistance"; Proceedings on SPIE; vol. 8325; 83250U; (2012).

(Continued)

*Primary Examiner* — Jack Berman
(74) *Attorney, Agent, or Firm* — Miles & Stockbridge P.C.

(57) ABSTRACT

The present invention pertains to a method and device for quantitatively evaluating the degree and characteristics of wiggling, which is a phenomenon that occurs in electronic device fabrication processes and consists of the deformation in the same shape of the left and right edges of fine line patterns, and takes advantage of the fact that this wiggling is included in measured values for line edge variation but not line width variation by acquiring the differences between these values. Further, the present invention is configured so as to calculate line center positions and use the distribution of the deviation from the average line center position as an indicator. Additionally, the present invention is configured to quantify wiggling characteristics by outputting a coefficient of wiggling correlation between lines or a wiggling component synchronized between lines as an indicator.

18 Claims, 10 Drawing Sheets

(52) U.S. Cl.
CPC . *H01J 2237/22* (2013.01); *H01J 2237/24592* (2013.01); *H01J 2237/28* (2013.01); *H01J 2237/2809* (2013.01); *H01J 2237/2817* (2013.01)

(56) References Cited

U.S. PATENT DOCUMENTS

| | | | |
|---|---|---|---|
| 7,366,620 B2 * | 4/2008 | Yamaguchi | G01B 15/08 382/145 |
| 2003/0021463 A1 | 1/2003 | Yamaguchi et al. | |

OTHER PUBLICATIONS

Lee, T. et al.; "Application of DBM System to overlay varication and wiggling quantification for advanced process"; Proceedings on SPIE; vol. 8324; 83241B; (2012).

International Search Report from International Patent Application No. PCT/JP2014/064006, Jul. 29, 2014.

* cited by examiner

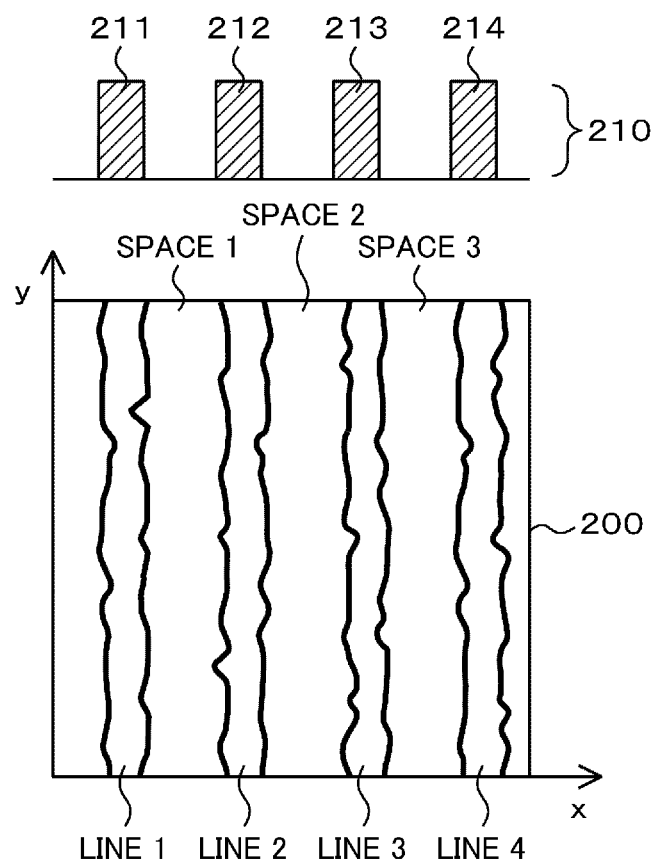
F I G. 2

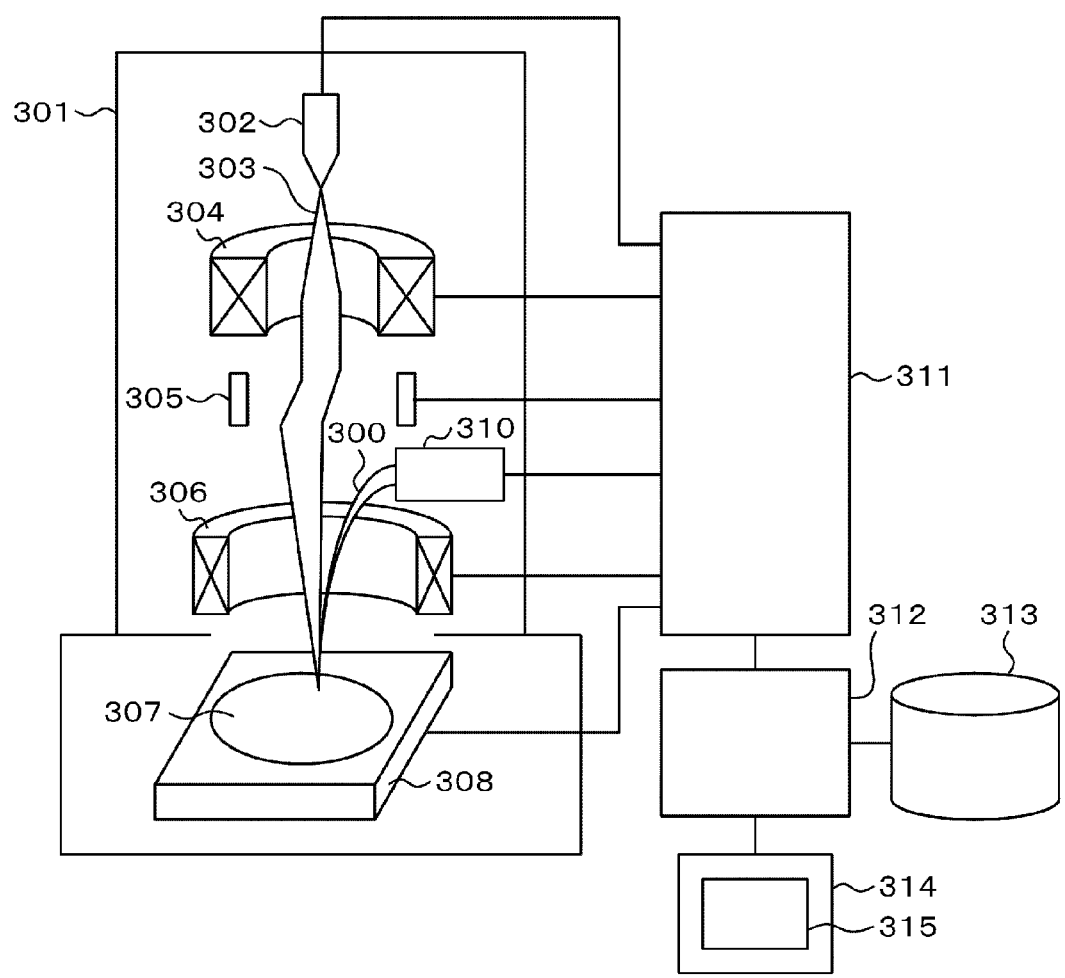
F I G. 4

F I G. 7
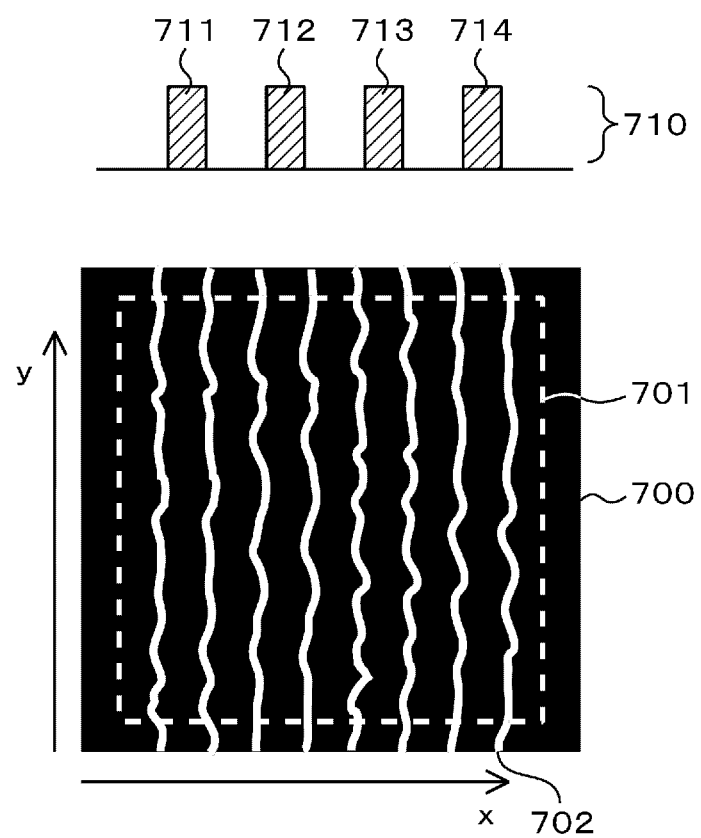

F I G. 8
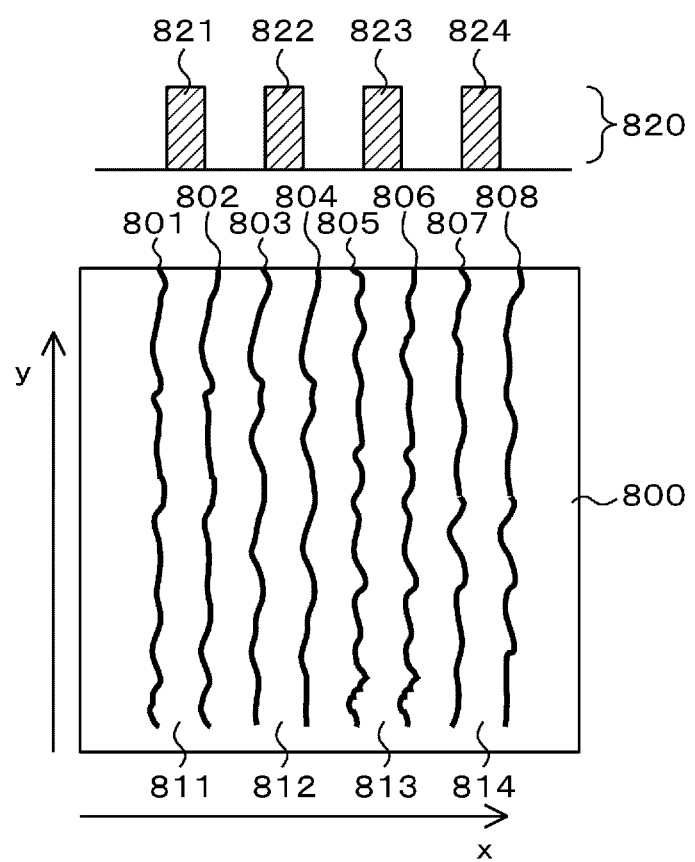

F I G. 1 2
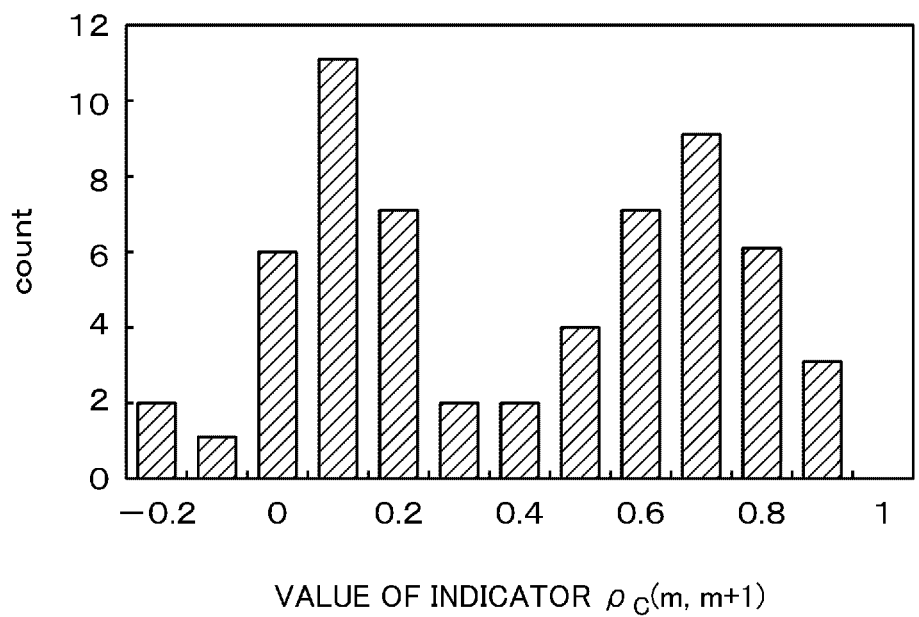

METHOD AND DEVICE FOR LINE PATTERN SHAPE EVALUATION

TECHNICAL FIELD

The invention relates to a method and device for evaluating the shape of a fine line pattern in the manufacturing processes of an electronic device and an optical device.

BACKGROUND ART

In the recent fine processing technique represented by the LSI manufacturing technique, according to miniaturization of a pattern, improvement in the yield is getting difficult. Therefore, the pattern measurement and the shape inspection performed after the lithography and the etching becomes more important than ever in the following two points. The first point is a pass or fail judgment by an observer himself or herself. During the manufacturing processes, finding a defect in as early stage as possible to retry the processing or abandon the above defect improves the productivity in the end. The second point is a monitoring of the state of a processing device and the process. When a trouble of a device and an error on the process are detected through an inspection, the result is fed back, hence to make it possible to avoid a further failure in the processing. The basic pattern used in the manufacturing process is a line pattern and therefore, the size of a fine line pattern and the shape inspection at high accuracy are important for improving the productivity of a product.

The size of a target pattern is miniaturized in 100 nm and less; therefore, the above mentioned inspection is performed by electron microscopic observation in many cases. The effective inspection method of a fine pattern is to analyze the observation image above the pattern, which is obtained with a Scanning Electron Microscope (SEM). When the size of the pattern is some hundreds nm or more, it may be similarly observed and analyzed from the above with a laser microscope. In any case of using the SEM and the laser microscope, only the observation cannot detect the pattern accurately and cannot be applied to the production management. It is necessary to calculate an indicator enabling a pass or fail judgment on the pattern through analysis on the observation image from the above. So far, the size of an important pattern, of the device patterns, from a viewpoint of the product performance management is called Critical Dimension, or CD, which has been regarded as an indicator. According to the miniaturization of the pattern, however, not only an average CD but a local fluctuation (Linewidth roughness, or LWR) of line width caused by the microscopic asperities in a line pattern edge (Line-edge roughness, or LER) have to be quantified for the use as an indicator. Even when the CD is as designed, if the LWR is larger, the performance of a device is insufficient. This is specifically described in Non-Patent Literature 1.

When further miniaturization proceeds, when the pitch of the line pattern becomes 80 nm or less, a new phenomenon occurs. This is such a phenomenon that, with the width of a line kept at constant, the position of the center of the line is fluctuated. When there is a deterioration of the line shape (hereinafter, called wiggling), for example, the resistivity of LSI wiring is deviated from the design value, and a short or an open failure occurs when the overlapping error between the upper and lower layers becomes large. Therefore, this has to be detected. Here, when wiggling occurs after the formation of a pattern and when a line is formed with the line center position fluctuated from the start, it is similarly called wiggling in the both cases.

This wiggling, however, cannot be detected by the conventional CD measurement and the LWR measurement. This is because the CD and the LWR do not change regardless of the presence of the wiggling. The LER measurement can detect the wiggling; however, even in this case, it cannot be distinguished from the ordinal LER in which the left and right of a line are not synchronized, naturally generated at random by the unevenness of a resist material and in the development process. This phenomenon is taken, for example, in the above Non-Patent Literature 1. In this document, since wiggling is found when the size value of a line pattern is a predetermined value or less, the maximum pattern size that may have the wiggling is set at an indicator, under the condition of pattern forming process and according as the size value is smaller, the process is evaluated better.

As a trial of quantifying the degree of wiggling in a line pattern, there is proposed an evaluating method by an indicator in combination of LER, LWR, and SWR (Space width roughness) in Non-Patent Literature 2.

Other than the above, for the purpose of seeking for a cause of the LER, there is proposed a method of correlating the shape between left and right edges of a line. This is disclosed in Patent Literature 1.

CITATION LIST

Patent Literature

PLT 1: Japanese Patent Application Laid-Open No. 2003-03713 Non-Patent Literatures Non-PLT 1: Y. Someya et al. "Spin-on-Carbon-Hardmask with high wiggling resistance" Proceedings of SPIE, Vol. 8325, 83250U, 2012.

Non-PLT 2: T. Lee et al. "Application of DBM system to overlay verification and wiggling quantification for advanced process" Proceedings of SPIE, Vol. 8324, 83241B, 2012.

SUMMARY OF INVENTION

Technical Problem

In the Non-Patent Document 1, since the wiggling is found when the size value of the line pattern is a predetermined value or less, the maximum pattern size that may have the wiggling is set as an indicator, under the condition of pattern forming process and according as the size value is smaller, the process is evaluated better. However, what is used for determining whether or not there is the wiggling in the pattern image is not clear. In the future, supposedly the process evaluation as mentioned in this document will be frequently performed. Accordingly, in a fine pattern formation process, a method of quantifying the degree and the characteristic of this wiggling is strongly required.

Further, in the evaluation method by the indicator in combination of LER, LWR, and SWR (Space width roughness) disclosed in Non-Patent Document 2, it is not known that the indicator shows what of the wiggling is digitalized. Further, when the wiggling occurs in all the lines synchronously, the LWR and the SWR become extremely smaller values, and therefore, it is the same as the measurement of the LER. Accordingly, the sensitivity to the wiggling becomes low.

Further, in the method of correlating the shape of the left and right edges of a line as disclosed in the Patent Document 1, similarity of the shape of the left and right line edges can be measured using this indicator and correlation factor $\rho$, and the fluctuation of the line center can be indirectly detected. Only this, however, is not enough to know the degree of the wiggling of the line. The $\rho$ is the dimensionless quantity, taking the value from 0 to 1; when the left and right edges are completely of the same shape, it becomes 1. However, the size of the roughness of the edge itself cannot be known.

In order to solve the above problems of the conventional techniques to improve the productivity of an electron device and an optical device, the invention is to provide a pattern shape evaluation method of quantifying wiggling, from an observation image of a fine line pattern from a top view, in the inspection process and the characteristics of the wiggling for evaluating the process that may cause the wiggling.

Solution of Problem

In order to solve the above problems, the evaluation method in the invention is a method of evaluating a shape of a line pattern of a sample in an image obtained by irradiating the sample with a charged particle beam, including: an extraction process of extracting edge points at both sides of a contour of the line pattern; a fluctuation amount calculation process of calculating a fluctuation amount of the edge points at the both sides, in a direction of extending the line pattern; a width fluctuation amount calculation process of calculating a fluctuation amount of widths between the edge points at the both sides, in the direction of extending the line pattern; and a difference calculation process of calculating a difference between the fluctuation amount of the edge points at the both sides and the fluctuation amount of the widths between the edge points at the both sides.

In order to solve the above problems, the evaluation method in the invention is a method of evaluating a shape of a line pattern of a sample in an image obtained by irradiating the sample with a charged particle beam, including: an extraction process of extracting edge points at both sides of a contour of the line pattern; a center point calculation process of calculating a center point of the line pattern based on the edge points at the both sides; an execution process of executing the extraction process and the center point calculation process a plurality of times, in a direction of extending the line pattern; and a dispersion value calculation process of calculating a dispersion value of the center points of a plurality of the line patterns calculated in the execution process.

In order to solve the above problems, the evaluation method in the invention is a method of evaluating a shape of a line pattern of a sample in an image obtained by irradiating the sample with a charged particle beam, including: an extraction process of extracting edge points of a contour of the line pattern; a fluctuation amount calculation process of calculating a fluctuation amount of the edge points in a direction along the contour of the line pattern, in a direction of extending the line pattern; and a similarity calculation process of calculating similarity between the fluctuation amount and a fluctuation amount of edge points of a line pattern adjacent to the above mentioned line pattern.

In order to solve the above problems, the evaluation method in the invention is a method of evaluating a shape of a line pattern of a sample in an image obtained by irradiating the sample with a charged particle beam, including: an extraction process of extracting edge points at both sides of a contour of the line pattern; a center point calculation process of calculating a center point of the line pattern based on the edge points at the both sides; an execution process of calculating a fluctuation amount of the center points of the line patterns by several times of execution of the extraction process and the center point calculation process, in a direction of extending the line pattern; an adjacent pattern execution process of executing the execution process also in other adjacent line patterns; and a similarity fluctuation amount calculation process of calculating a fluctuation amount that is similar in the line patterns and the other line patterns, based on the fluctuation amount of the center points of the line patterns and the fluctuation amount of the center points of the other line patterns.

In order to solve the above problems, the line pattern shape evaluation device in the invention includes: an image recording unit in which an image obtained by irradiating a sample with a charged particle beam is recorded; an extraction unit that extracts edge points at both sides of a contour of a line pattern in the image recorded in the image recording unit; a fluctuation amount calculation unit that calculates a fluctuation amount of the edge points at the both sides, in a direction of extending the line pattern; a width fluctuation amount calculation unit that calculates a fluctuation amount of widths between the edge points at the both sides, in the direction of extending the line pattern; and a difference calculation unit that calculates a difference between the fluctuation amount of the edge points at the both sides and the fluctuation amount of the widths between the edge points at the both sides.

In order to solve the above problems, the line pattern shape evaluation device in the invention includes: an image recording unit in which an image obtained by irradiating a sample with a charged particle beam is recorded; an extraction unit that extracts edge points at both sides of a contour of a line pattern in the image recorded in the image recording unit; a center point calculation unit that calculates a center point of the line pattern based on the edge points at the both sides; an execution unit that executes the processing by the extraction unit and the center point calculation unit a plurality of times, in a direction of extending the line pattern; and a dispersion value calculation unit that calculates a dispersion value of the center points of the line patterns calculated by the execution unit.

In order to solve the above problems, the line pattern shape evaluation device in the invention includes: an image recording unit in which an image obtained by irradiating a sample with charged particle beam is recorded; an extraction unit that extracts edge points at both sides of a contour of a line pattern in the image recorded in the image recording unit; a fluctuation amount calculation unit that calculates a fluctuation amount of the edge points in a direction along the contour of the line pattern, in a direction of extending the line pattern; and a similarity calculation unit that calculates similarity between the fluctuation amount and a fluctuation amount of the edge points in a line pattern adjacent to the line pattern.

In order to solve the above problems, the line pattern shape evaluation device in the invention includes: an image recording unit in which an image obtained by irradiating a sample with a charged particle beam is recorded; an extraction unit that extracts edge points at both sides of a contour of a line pattern in the image recorded in the image recording unit; a center point calculation unit that calculates a center point of the line pattern based on the edge points at the both sides; an execution unit that calculates a fluctuation amount of the center points of the line patterns by several times of processing by the extraction unit and the center point calculation. unit, in a direction of extending the line pattern; an adjacent pattern execution unit that executes the processing by the execution unit also in other adjacent line patterns; and similarity fluctuation amount calculation unit that calculates a fluctuation amount at a position where the line pattern is similar to the other line pattern, based on the fluctuation amount of the center points of the line patterns and the fluctuation amount of the center points of the other line patterns.

Advantageous Effects of Invention

In order to solve the above problems, the line pattern shape evaluation device includes: an image recording unit of recording an image obtained by irradiating a sample with a charged particle beam; an extraction unit of extracting edge points at both sides of a contour of a line pattern in the image recorded in the image recording unit; a center point calculation unit of calculating a center point of the line pattern based on the edge points at the both sides; an execution unit of executing a fluctuation amount of the center point of the line pattern by several times of execution of the extraction unit and the center point calculation unit, in a direction of extending the line pattern; an adjacent pattern execution unit of executing the processing of the execution unit also in another adjacent line pattern; and similarity fluctuation amount calculation unit of calculating a fluctuation amount at a position similar to in the line pattern and the other line pattern, based on the fluctuation amount of the center point of the line pattern and the fluctuation amount of the center point of the other line pattern.

BRIEF DESCRIPTION OF DRAWINGS

FIG. 2 is a schematic view illustrating the pattern edges extracted from the observation image from a top view obtained by picking up a plurality of line patterns with SEM and a cross section of the line patterns.

FIG. 4 is a block diagram illustrating the schematic structure of a device for carrying out the invention.

FIG. 7 is a schematic view of the top view image obtained by picking up the line patterns with SEM according to the first example of the invention and a cross section of the line patterns.

FIG. 8 is a schematic view illustrating the positional data of the edges extracted from the top view image obtained by picking up the line patterns with the SEM according to the first example of the invention and a cross section of these line patterns.

FIG. 12 is a histogram of wiggling indicators calculated according to a third example of the invention.

DESCRIPTION OF EMBODIMENTS

The invention is mainly characterized by using that the measured value of a fluctuation in the edge of a line pattern includes the wiggling of the line pattern but not includes a fluctuation in the line width and taking a difference of these.

Specifically, the invention relates to a method of seeking the information on a fluctuation of the edges and the width of a line pattern in the line longitudinal direction, in the SEM image of the line pattern, or a method of calculating an indicator value of wiggling of the line pattern from the fluctuation information on the center position of the line pattern in the longitudinal direction, and a method of calculating an indicator value indicating the characteristic of the line center position fluctuation amount by requiring the correlation of the shape between the left and right edges in the line patterns or the correlation of the shape between the center positions of the line patterns.

Figure 1:
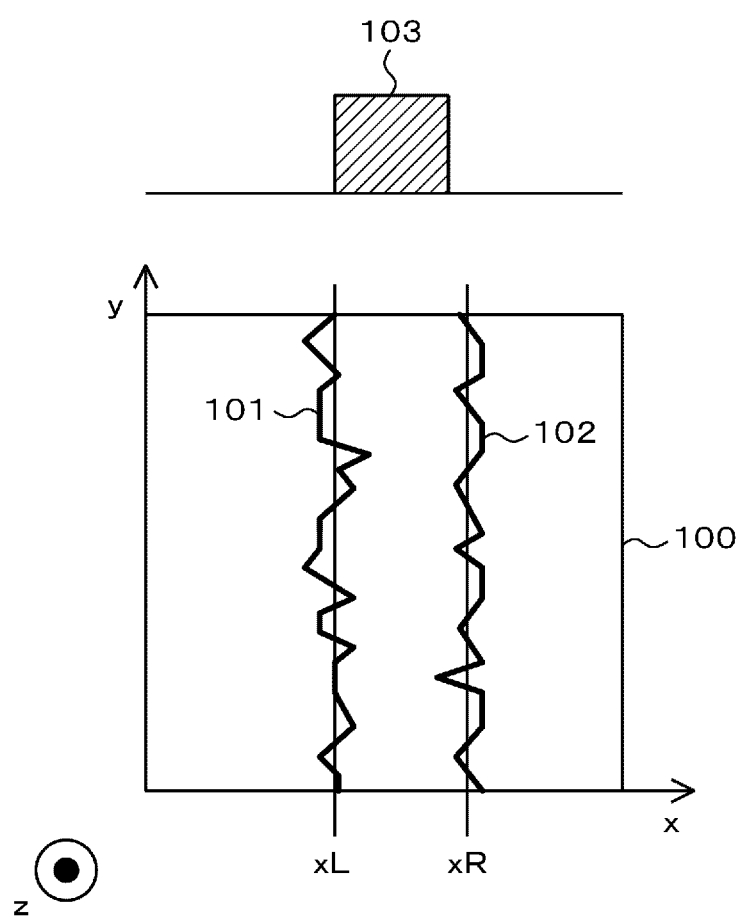
FIG. 1 is a schematic view illustrating pattern edges extracted from the observation image from a top view obtained by picking up one line pattern with SEM and a cross section of the line pattern.

The characteristic method is as follows:

At first, according to the observation image from a top view of a line pattern, the positions of the left and right edges of one line are extracted. An example of the top view observation image 100 of the extracted edges is shown in FIG. 1, together with the schematic view 103 of its cross section. The x, y, and z axes are set as illustrated in the drawings. The left edge of the line pattern is represented by a set of the x coordinates $\{x(L, i)|i=1, 2, \ldots n\}$ and the right edge thereof is represented by a set of the x coordinates $\{x(R, i)|i=1, 2, \ldots n\}$. In FIG. 1, the edge points are connected by a straight line and displayed as a polygonal line (101, 102). The symbols L and R respectively represent left and right and n represents the total number of the points indicating the edges. The interval of the edge points in the y direction is defined as $\Delta y$. The average value of the x coordinates of the left edges is defined as xL and the average value of the x coordinates of the right edges is defined as xR. The variable indicating the position of the edge point is set by the unit of nm both in the x coordinate and the y coordinate.

Each shape of the left and right edges can be represented by the group of the points as $\{\Delta x(L, i) i=1, 2, \ldots n\}$ $\{\Delta x(R, i)|i=1, 2, \ldots n\}$. Here, the $\Delta x(L, i)$ and $\Delta x(R, i)$ are given by the following expression 1.

$$\Delta x(k, i) = x(k, i) - xk \qquad \text{[Expression 1]}$$

k=L, R

The longitudinal direction of the line pattern is in parallel to the y direction. When it is not in parallel, an approximate straight line of the line edges is calculated prior to the calculation, a deviated amount from the approximate straight line may be defined as $\Delta x(L, i)$ and $\Delta x(R, i)$, instead of the expression 1, or, the image may be rotated to be in parallel to the y direction and the longitudinal direction of the line.

Fluctuation amount of the line edge as for the left and right edges can be represented by the following expression 2.

$$\sigma_k^2 = \frac{1}{n(n-1)}\sum_{i=1}^{n} \Delta x(k, i)^2 \qquad \text{[Expression 2]}$$

$$k = L, R$$

The fluctuation amount of the line width can be represented by the following expression 3.

$$\sigma_w^2 = \frac{1}{n(n-1)}\sum_{i=1}^{n} \{x(R, i) - x(L, i)(xR - xL)\}^2 \qquad \text{[Expression 3]}$$

Here, the suffix w at the left side represents the width.

By using these amounts, the size of a portion common in the left and right, of the left and right edge position fluctuations of a line, can be obtained by the following expression 4.

$$\sigma_{wig}^2 = (\sigma_L^2 + \sigma_R^2 - \sigma_w^2)/2 \qquad \text{[Expression 4]}$$

The left side $\sigma_{wig}^2$ and $\sigma_{wig}$ of the expression 4 or the constant multiplication of $\sigma_{wig}$ (for example, $3\sigma_{wig}$) may be defined as an indicator of the wiggling amount. Here, the suffix wig represents the wiggling.

Further, the invention can display the $\sigma_{wig}^2$ separately in the frequency component. Two sets {$\Delta x$ (L, i)|i=1, 2, . . . n} and {$\Delta x$(R, i)|i=1, 2, . . . n} are Fourier-transformed and a power spectrum of LER of the left and right edges can be calculated from the obtained Fourier coefficient. Further, from {x (R, i)–x(L, i)–(xR–xL)|i=1, 2, . . . n}, a power spectrum of LWR can becalculated. When the power density as for the frequency f is defined as $PSD_L(f)$, $PSD_R(f)$, and $PSD_w(f)$, a power density PS $D_{wig}(f)$ is defined by the following expression 5.

$$PSD_{wig}(f) = (PSD_L(f) - PSD_R(f) - PSD_w(f))/2 \qquad \text{[Expression 5]}$$

Further, the invention is characterized by defining the line center position as the average of the left and right edge positions and using its distribution as another indicator of the wiggling amount. Since this indicator directly represents the accurate line center position in the pattern transfer, it is used for evaluating the quality of the formed pattern and for evaluating the position deviation amount described later. Especially, the following method is better.

The x coordinate cx i) of the line center position is calculated by the expression 6.

$$xc(i) = (x(L, i) + x(R, i))/2 \qquad \text{[Expression 6]}$$

Here, the distribution of the line center position is calculated by the expression 7. Here, the suffix c indicates the center.

$$\sigma_c^2 = \frac{1}{n(n-1)}\sum_{i=1}^{n}\{xc(i) - (xR - xL)/2\}^2 \qquad \text{[Expression 7]}$$

The left side $\sigma_c^2$ of the expression 7, $\sigma_c$, or the constant multiplication of $\sigma_c$ (for example, $3\sigma_c$) may be used as an indicator of the wiggling amount. Alternatively, there is a method of using a difference between the maximum and the minimum of the values xc (i) as an indicator.

These values do not agree with a genuine wiggling amount because they are affected by the LER generated at random. However, they are important when a wiring pattern is coupled there from an upper layer or a lower layer of the layer including this line. Generally, since the positioning between the layers is not complete, the position deviation amount (called overlay or overlay error) is measured. When a line is wiggled, however, a position deviation amount between the layers measured at a point is different from a position deviation amount between the layers measured at another point. Specifically, the measurement amount of the position deviation amount has a distribution corresponding to $\sigma_c$. Accordingly, when a line is wiggled, the apparent error of the measured position deviation amount has to be incorporated into the effect of $\sigma_c$.

Further, the invention is characterized by calculating correlation of the shape between the left and right edges of a space, calculating correlation of the shape between the line center positions of the two adjacent lines, and calculating the line center position fluctuation amount common in the both line patterns, in order to assume a cause of the wiggling. The detailed description will be made as follows.

At first, an observation image 200 including a plurality of line patterns is obtained. The edges extracted from the above are illustrated in FIG. 2, together with the schematic view 210 of a cross section of the line patterns 211 to 214. Hereinafter, a method of taking correlation of the shape between the left and right edges of a space will be described. Hereinafter, the lines 1 to 4 and the space patterns 1 to 3 are numbered as illustrated in FIG. 2 and the shapes of the edges obtained by applying the expression 1 to the left and right edges of each line are represented by the sets {$\Delta x$ (m, L, i)|i=1, 2, . . . n} and {$\Delta x$ (m, R, i)|i=1, 2, . . . n}. Here, the m indicates the number of a line.

Correlation $\rho_s(m)$ of the shape between the left and right edges in the number m of space is calculated by the expression 8.

$$\rho_s(m) = \frac{1}{\sigma_R(m)\cdot\sigma_L(m+1)}\sum_{i=1}^{n} \Delta x(m, R, i)\cdot\Delta x(m+1, L, i) \qquad \text{[Expression 8]}$$

Here, $\sigma_R(m)$ and $\sigma_L(m+1)$ are $\sigma_R$ and $\sigma_L$ obtained by applying the expression 2 to the right edge of the $m^{th}$ line and the left edge of the $m+1^{th}$ line respectively. The suffix s of the left side of the expression 6 indicates a space. When $\rho_s(m)$ is close to 1, the shape of the wiggling in the $m^{th}$ line is similar to that in the $m+1^{th}$ line; according to this, it can be assumed that the two lines are wiggled by the same cause.

Next, correlation of the shape between the line center positions of the two adjacent lines will be described. The correlation $\rho_c(m, m+1)$ of the shape between the center positions in the $m^{th}$ and the $m+1^{th}$ lines is calculated by the expression 9.

$$\rho_c(m, m+1) = \qquad \text{[Expression 9]}$$
$$\frac{1}{\sigma_c(m)\cdot\sigma_c(m+1)}\sum_{i=1}^{n} \Delta xc(m, i)\cdot\Delta xc(m+1, i)$$

Here, the $\sigma_c(m)$ is the fluctuation amount of the line center position calculated by applying the expression 6 to the edge of the $m^{th}$ line pattern.

Further, the following expression 10 is formed.

$$\Delta xc(m, i) = xc(m, i) - (xR(m) + xL(m))/2 \qquad \text{[Expression 10]}$$

Here, the xc (m, i) is the x coordinate of the $i^{th}$ line center obtained by applying the expression 4 to the $m^{th}$ line pattern and the xR(m) and xL (m) are respectively the average values of the x coordinates of the left and right edges in the $m^{th}$ line pattern. The suffix c of $\rho_c$(m, m+1) indicates the center. This amount takes from 0 to 1 and according to the larger value, the $m^{th}$ and the $m+1^{th}$ line patterns are wiggled in the same shape, showing that there is a high possibility of the wiggling caused by the same cause.

The fluctuation amount of the line center position common to the $m^{th}$ and the $m+1^{th}$ line patterns is defined as follows. At first, the average value xD(m, m+1) of the intervals between the $m^{th}$ and the $m+1^{th}$ line patterns is defined as the following expression 11.

$$xD(m, m+1) = \frac{1}{n}\sum_{i=1}^{n}(xc(m+1, i) - xc(m, i)) \quad \text{[Expression 11]}$$

Next, an interval distribution of the line patterns $\sigma_{LD}$(m, m+1) is calculated.

$$\sigma_{LD}(m, m+1)^2 = \quad \text{[Expression 12]}$$
$$\frac{1}{n(n-1)}\sum (xc(m+1, i) - xc(m, i) - xD(m, m+1))^2$$

Next, the fluctuation amount of the line center position common to the both line patterns is required.

$$\sigma_u(m, m+1)^2 = (\sigma_c(m)^2 + \sigma_c(m+1)^2 - \sigma_{LD}(m, m+1)^2)/2 \quad \text{[Expression 13]}$$

The left side of this expression $\sigma_{LL}$(m, m+1)$^2$, $\sigma_{LL}$(m, m+1), or the constant multiplication of $\sigma_{LL}$(m, m+1) (for example, $3\sigma_{LL}$(m, m+1)) maybe used as the indicator of the line center position fluctuation amount common to the both line patterns.

Further, in order to assume the cause of the wiggling, the invention is characterized by displaying the correlation $\rho_c$(m, m+1) of the shape between the line center positions of the adjacent two line patterns in order of alignment of the line patterns and displaying a histogram of the $\rho_c$(m, m+1) measured at several positions.

Further, in order to assume the cause of the wiggling, the invention is characterized by displaying the subtracted one of the double power spectrum of LWR from the power spectrum of LER.

In order to perform a pass or fail judgment of the observation target according to the above method and monitor the pattern forming process, such a system can be configured by coupling a computer for performing the detection of the edges and the above calculation to an observation device such as an electron microscope, selecting an image, and performing the evaluation.

A method of evaluating the wiggling of a line pattern formed on a wafer through the line pattern forming process of a semiconductor device having been described above, with the SEM image, will be described using the flow chart of FIG. 3.

At first, an image obtained by the SEM imaging a sample (semiconductor wafer) with the line patterns formed on the surface is entered and at the same time, a target region for analysis is specified (S301). In the flow thereafter, analysis is performed on a line or a space included in this region. Then, an evaluation item is entered (S302). The evaluation item includes an indicator of the wiggling amount for checking the presence of the wiggling (wiggling amount: $3\sigma_{wig}$, line center position fluctuation amount: $3\sigma_c$), a spectrum for analyzing the characteristic of the wiggling (power density: $PSD_{wig}$(f)), a wiggling synchronicity indicator for evaluating how the wiggling is spatially aligned (correlation of left and right edges of a space pattern: $\rho_s$, correlation of line center position fluctuations: $\rho_c$, wiggling synchronization component $3\sigma_{LL}$). One or some of these three items are entered as the evaluation item.

Then, the entered SEM image is processed to extract the edges of a line pattern (S303), and the average values xL and xR of the coordinates of the left and right edges of the line pattern image are calculated (S304). Then, it is checked whether or not the evaluation item entered in S302 is the wiggling amount (S305); in the case of YES, the processing proceeds to S306, where an indicator for use in evaluation is selected. When $3\sigma_{wig}$ is selected, the processing proceeds to S307.

In this flow, at first, the left and right edge shapes of a line pattern are calculated from the SEM image of the line pattern (S307) according to the expression 1, the fluctuation amounts of the left and right edges are calculated (S308) according to the expression 2, the fluctuation amount of the line width is calculated (S309) according to the expression 3, the fluctuation amount $\sigma_{wig}^2$ of the edge position common to the left and right edges of the line pattern is calculated (S310) according to the expression 4, and the wiggling indicator value $3_{wig}$ is obtained from the calculated result (S311).

Next, it is checked whether or not the required wiggling indicator value $3\sigma_{wig}$ is less than a predetermined reference value α (S312). When the wiggling indicator value $3\sigma_{wig}$ is less than the reference value α (in the case of YES in S312), the wiggling of this line pattern is judged quite small and the wiggling indicator value $3\sigma_{wig}$ is output (S350), thereby finishing the processing.

On the other hand, when the wiggling indicator value $3\sigma_{wig}$ is the same with the predetermined reference value a or more (in the case of NO in S312), such information that "the wiggling in this observation target is large and further evaluation of synchronicity should be performed in order to look into the cause of the wiggling" is added to the data to be output in S313 and then output (S350).

In the process of S306, when $3\sigma_c$ is selected as the indicator of the wiggling amount, the processing proceeds to S314, where the center position coordinate of the line pattern is required by using the expression 6, its distribution is required according to the expression 7 (S315), and further the line center position fluctuation amount $3\sigma_c$ is calculated from the above value.

Then, it is checked whether or not the value $3\sigma_c$ is less than a predetermined reference value β (S317). When it is less (in the case of YES in S317), the wiggling of this line pattern is judged quite small and the wiggling indicator $3\sigma_c$ is output (S350), thereby finishing the processing.

On the other hand, when the wiggling indicator $3\sigma_c$ is β or more (in the case of NO in S317), such information that "the wiggling in this observation target is large and further evaluation of synchronicity should be performed in order to look into the cause of the wiggling" is added to the data to be output in S313 and then output (S350).

In the check of S305, when the evaluation item is not the indicator of the wiggling amount (in the case of NO), the processing proceeds to S318, where it is determined whether or not the frequency analysis of the wiggling is performed; in the case of YES, power spectrums of LER in the left and right edges of the line pattern are seeked (S319), then, the power spectrum of LWR is seeked (S320), the power spectrum $PDS_{wig}$ of the wiggling is calculated (S321) by using the expression 5, and the result is output (S350).

On the other hand, in the case of NO in S318, a flow for requiring the synchronicity indicator value of the wiggling, useful for looking into the cause, is performed. Since the synchronicity indicator of the wiggling has various types, at first, an indicator is selected in the processing flow (S322).

Here, when the correlation ρs between the left and right edges of a space between the adjacent line patterns is selected as the indicator, the processing proceeds to S323, where the ρs is calculated by using the expression 8 and output (S350).

When the correlation pc of the center position between the adjacent line patterns is selected as an indicator, the processing proceeds to S324, where the ρc is calculated by using the expression 9 and output (S350). When the synchronization component 3σLL of the adjacent line wiggling is selected, the processing proceeds to S325, where a line center distance is first calculated according to the expression 11. Then, the processing proceeds to S326, where a distribution of the line center distance values calculated in the former process is calculated according to the expression 12. Then, the processing proceeds to S327, where a dispersed value of the synchronization component in the adjacent line wiggling is calculated by using the expression 13, and the processing proceeds to S328, where a line wiggling synchronization component 3σLL is output (S350).

When such information is output that the wiggling is large because the indicator value exceeds a reference value in S312 or in S317, a plurality of correlations $\rho_c(m, m+1)$ of the shape of the line center position between the adjacent line patterns are required (S331) as the information for assuming the cause of the wiggling, separately from the algorithm shown by the flow in the same figure, the several correlations $\rho_c(m, m+1)$ are displayed in the order of alignment of the line patterns, and a histogram of the correlations $\rho_c(m, m+1)$ is displayed on a screen.

Examples to which the invention is applied will be described using the drawings.

EXAMPLE 1

A first example of the invention will be described according to FIGS. 4 to 8. In the example, the indicator $\sigma_{wig}$ of the wiggling in the edge of the line pattern is used to do a pass or fail judgment on the line pattern after the etching, and as for the line pattern having the wiggling indicator value exceeding the allowance limit, the cause of the wiggling generation is to be assumed.

In the example, a sample image of an inspection target is obtained by using the SEM (hereinafter, referred to as CD-SEM) having a length measuring function as illustrated in FIG. 4 and the image is processed to assume the cause of the wiggling.

The CD-SEM illustrated in FIG. 4 is composed of a lens tube 301, an electron source 302, a focusing lens 304 for converging the electron beams 303 emitted from the electron source 302, a deflection electrode 305 for deflecting the converged electron beams, an objective lens 306 for irradiating the surface of a wafer 307 that is a sample with the deflected electron beams in a converged way, a table 308 movable on the XY surface with the sample 307 mounted there, a detector 310 for detecting the secondary electrons (including the reflected electron) generated from the sample 307 irradiated with the electron beams 303, a control system 311 for processing the signal output from the detector 310 and controlling the electron source 302, the focusing lens 304, the deflection electrode 305, the objective lens 306, and the table 308, a computer 312 coupled to the control system 311, a data recording device 313 coupled to the computer 312, and a monitor 314 including a display 315.

Figure 5:
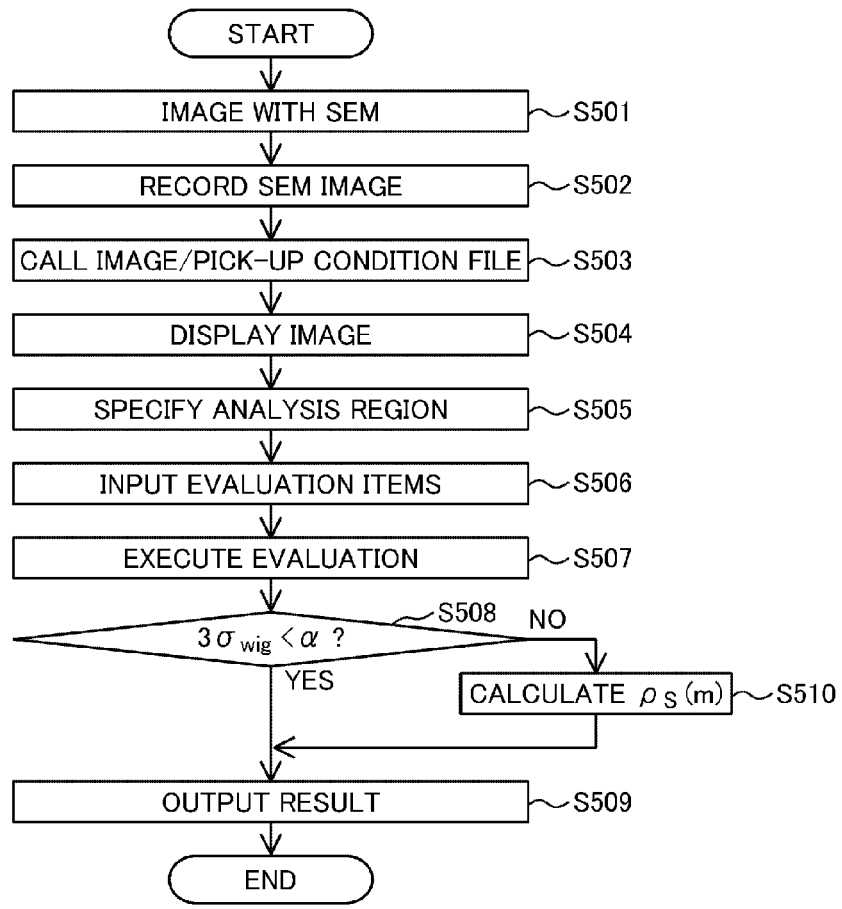
FIG. 5 is a flow chart illustrating the flow of the processing according to a first example of the invention.

As illustrated in FIG. 5, in the structure illustrated in FIG. 4, the procedure of the processing in the example includes a step of feeding an instruction to the control system 311 of the CD-SEM from the computer 312, moving to the device the wafer 307 with the line patterns of silicon formed there according to the etching processing, moving and adjusting the stage 308 so that the line pattern group may come into a view of observation, and electrically adjusting the convergence lens 304, the objective lens 306, and the deflection electrode 305 to obtain a top view image of the pattern formed on the sample 307 according to a signal from the computer 312 (S501). Next, the obtained image data is once recorded in a recording area within the computer 312, and then, saved in the data recording device 313 together with the data of the image picking up condition (S502).

Thereafter, a program for evaluation is started according to an instruction from the computer 312. An image that is an evaluation target is specified in the program, a file of the image and the image picking up condition is called from the data recording device 313 (S503: corresponding to S301 of FIG. 3), and the observation image is displayed on the screen 315 of the monitor 314 (S504). Then, a target region for analysis is specified on the image displayed on the screen 315 of the monitor 314 (S505: corresponding to S302 of FIG. 3).

Figure 3:
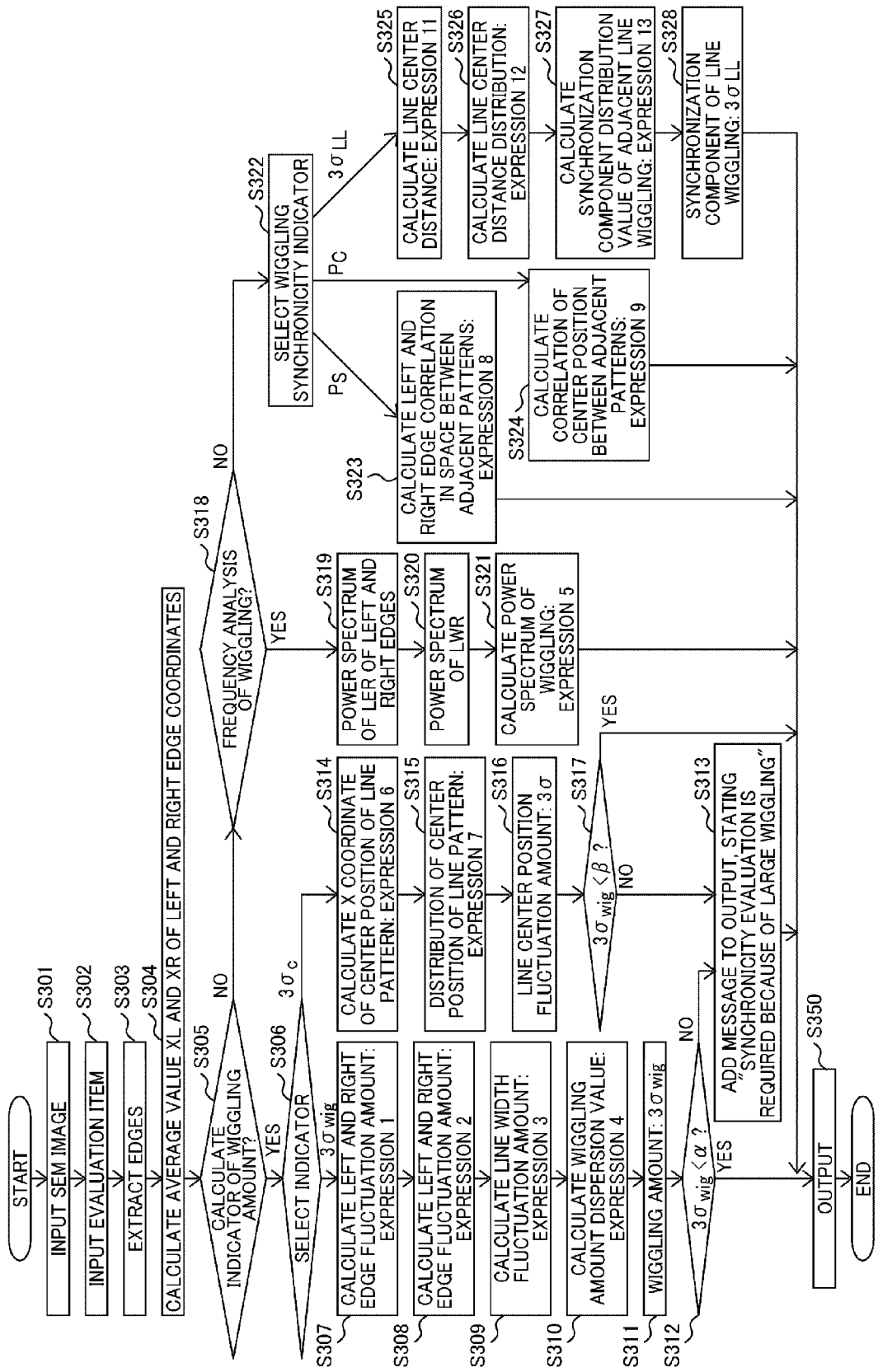
FIG. 3 is a flow chart illustrating the flow of the whole processing according to the invention.

Of a plurality of analysis methods (refer to FIG. 6) displayed on the screen 315 of the monitor 314 where the analysis region is specified, the analysis type $3\sigma_{wig}$ to be executed this time is specified (S506) and an execute button displayed on the monitor 314 is clicked, to execute the specified analysis (S507: corresponding to S307 to S311 of FIG. 3).

Next, the calculated $3\sigma_{wig}$ by the analysis is compared with a predetermined allowance upper limit α (S508: corresponding to S312 of FIG. 3) ; when the $3\sigma_{wig}$ is less than the a (in the case of YES), it is determined that the wafer 307 that is the inspection target is good and the result is output (S509: corresponding to S350 of FIG. 3), thereby finishing the evaluation.

On the other hand, when the $3\sigma_{wig}$ is more than the allowance upper limit α in S508 (in the case of NO), the processing proceeds to S510, where the $\rho_s(m)$ is automatically calculated according to the expression 8 as the information of looking into the cause and the result is output, according to the flow. Here, instead of S510, only a warning may be added to the flow, similarly to S313, and output, to hand the indicator calculation for looking into the cause to an operator.

Next, an example of the processing performed in S504 to S510 will be described hereinafter.

Figure 6:
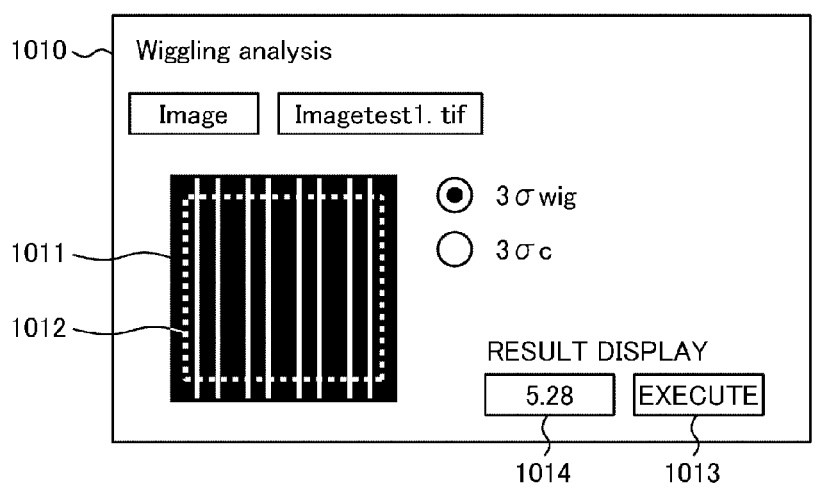
FIG. 6 is a front view of an operation window displayed on a monitor according to the first example of the invention.

FIG. 7 is a view with the top view image of the line patterns observed in the example binarized and displayed in black and white, illustrating an image 700 displayed on the screen 315 of the monitor 314 in S504. The actual image illustrated by the reference numeral 700 is a monochromatic image having shades of gray but it is binarized here for the sake of simplicity. The size of the image 700 of FIG. 7 is 450 nm in the x axis direction and 2560 nm in the y axis direction. In FIG. 7, a cross-sectional view 710 is displayed along the same x axis (a direction perpendicular to the line patterns 711 to 714) so as to make it easy to understand the rough portion in the image 700. A white stripe shaped region 702 indicates the vicinity of each edge of the line patterns 711 to 714. FIG. 6 is a view illustrating the window displayed on the screen 315 of the monitor 314 and an image 1011 in the left side is the same as the image 700 illustrated in FIG. 7.

In S505, in the window 1010 on the screen 315 of the monitor 314, a target region for analysis is specified on the image. This region is within a frame 701 of a white dotted line in FIG. 7 and inside of a dotted line 1012 in FIG. 6. The size of the frame 701 of the dotted line in FIG. 7 along the y direction is 2000 nm. In S506, an analysis method to be used this time is selected from the three analysis indicators displayed on the window 1010 of FIG. 6, that are, the wiggling amount indicator $3\sigma_{wig}$ and the wiggling amount indicator especially of the line center $3\sigma c$ of the wiggling amount indicators. In this example, the case of selecting the $3\sigma_{wig}$ will be described.

An analysis indicator is selected and the "Execute" button 1013 displayed on the window 1010 is clicked, hence to execute an instruction to calculate three times of the $\sigma_{wig}$ described later as an indicator of the wiggling as for the edges of the patterns within the frame 701, in S507. At first, the edges of the line patterns are extracted from the white stripe shaped region within the frame 701 of the dotted line through the image processing. FIG. 8 illustrates the above. FIG. 8 is a view for use in describing the calculation process and it is not displayed on the screen 315 of the monitor 314. Here, the edges 801 and 802 are the left and right edges of a line pattern 821 (in a top view, hereinafter represented by a line 811), the edges 803 and 804 are the left and right edges of a line 812 corresponding to a pattern 822, the edges 805 and 806 are the left and right edges of a line 813 corresponding to a pattern 823, and the edges 807 and 808 are the left and right edges of a line 814 corresponding to a pattern 824.

Together with the extraction of the pattern edges, the computer 312 calculates the wiggling amount by using the position data of these edges. The procedure is as follows. At first, $\sigma_{wig}^2$ is calculated as for the position data of the left and right edges 801 and 802 of the line 811 by using the expressions 1, 2, 3, and 4. This is the calculation result of the first line, and this amount is indicated as $\sigma1_{wig}^2$. The same calculation is performed on the lines 812, 813, and 814, to calculate the $\sigma_{wig}^2$ thereof as $\sigma2_{wig}^2$, $\sigma3_{wig}^2$, and $\sigma4_{wig}^2$. The arithmetic average of these four amounts is calculated and three times of its square root, that is the average $3\sigma_{wig}$ is displayed in an area near the corner of the image 1011 on the monitor. Its numeric is 5.28 nm.

In the step S508 of evaluating the analysis result, in a device manufactured by using this wafer, the allowance limit α of the $3\sigma_{wig}$ is previously set at 4 nm; therefore, in the S508, it is judged NO, and the processing proceeds to S510, where in order to specify the process that may cause the wiggling, a correlation $\rho_s(m)$ between the left and right edges of a space between the adjacent line patterns is calculated and the result is displayed on the screen (S509), thereby finishing the processing.

In this judgment, the actually measured value is compared with the allowance limit α previously entered, and when the former exceeds the latter, an alarm is set to sound, hence to perform the judgment automatically. Alternatively, the above-mentioned judgment results on several wafers can be output to the computer screen. A wafer judged pass is fed to the next process and a wafer judged fail is returned to the rework process; according to this, the productivity can be improved. From the edge position data of each line, the spectrum of the wiggling can be calculated according to the expression 5. According to this, when there is a characteristic cycle of the wiggling, it can be grasped.

A method of improving the yield by specifying a program for wiggling evaluation for a line pattern determined to have the $\sigma_{wig}$ equal to the allowance limit α or the more, in S508 and calculating the $\rho_s(m)$ in S510, to identify the process that may cause the wiggling to take a countermeasure, will be described.

On the image of the target pattern illustrated in FIG. 8, an evaluation program for calculating the $\rho_s(m)$ (m=1, 2, 3) as for 802 to 807, of the edges 801 to 808 of the lines 811 to 814, by using the expression 8 is specified and the evaluation program is executed.

As for the line patterns used in the example, the results of 0.67, 0.12, and 0.73 are obtained in the order of m. The processing is performed also on the nine line pattern images picked up at other spots of the same pattern region on the same wafer, and the total of 30 results are obtained and averaged, to get a large value, 0.56. According to this, it is judged that each line is not independently wiggled but synchronously wiggled. Thus, the cause of the wiggling can be assumed.

At first, such a possibility is pointed out that an extremely wiggled line pattern is generated and that this line pattern is in contact with the adjacent line pattern, resulting in a deformation as in the domino falling. However, since such a largely wiggled pattern as in contact with the adjacent line pattern is not observed, this possibility is denied. Next, such a possibility is pointed out that the film thickness of the lower layer and the wettability on the surface are locally changed and that the edges of the line patterns on the boundary are all bent at once. However, even in the check of the process, there is found no factor of fluctuation having the same space cycle as the wiggling in the state of the lower layer.

Finally, there is pointed out such a possibility that since this process includes two times of Self-aligned double patterning (SADP) of forming a film to the both sides of the formed line pattern and eliminating the original line pattern, to regard the film formed portion as a new line pattern, the LER of the firstly formed pattern is the cause of the wiggling.

Then, when the steps S401 to S412 are performed again on the pattern formed by introducing a material having the smaller LER at the first SADP of the line pattern formation, the average value of $\rho_s(m)$ is 0.20. At the same time, the wiggling amount $\sigma_{wig}$ itself becomes very small.

The example is improved by introducing the material having the smaller LER at the first SADP of the line pattern formation; therefore, the average value of $\rho_s(m)$ can be reduced and the wiggling amount $\sigma_{wig}$ itself can be reduced, hence to reduce the number of the fail wafers by half.

MODIFIED EXAMPLE 1

As a modified example 1 of the first example, the case of evaluating the wiggling with the wiggling evaluation indicator $\sigma_c$ instead of $\sigma_{wig}$ will be described. In an example using the $\sigma_{wig}$ as the above wiggling evaluation indicator, $\rho_s(m)$ is calculated in S510 for specifying the cause of the wiggling; however, when an observation target is electrically charged and a noise is larger constantly at one edge, the indicator $\rho_c(m, m+1)$ obtained by using the expressions 9 and 10, instead of $\rho_s(m)$, is used, to be able to measure with a high reproducibility although it takes a long time. In this case, the process that may cause the wiggling can be identified easily and the countermeasure can be taken on the above process, hence to improve the yield.

According to the example, the SEM image of the pattern formed on the substrate is processed to make it possible to evaluate the wiggling of the pattern quantitatively; therefore, the evaluation result is fed back to the process of forming a pattern to be able to form a pattern of a desired shape stably.

As the result of the above inspection, when it is judged fail, the target wafer is not transferred to the next process but is reworked in the former process.

The above inspection can avoid the production of a device having a lower performance and reduce the wastes. Especially when a characteristic frequency exists in the wiggling, performance deterioration of a device can be predicted by using it

EXAMPLE 2

Figure 9:
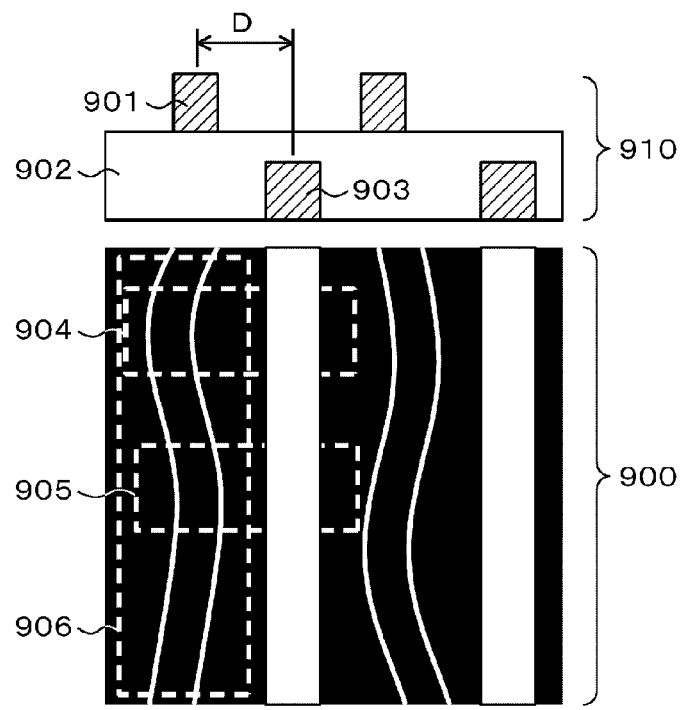
FIG. 9 is a schematic view illustrating a top view image obtained by picking up the line patterns formed in two layers with the SEM according to a second example of the invention and a cross section of the line patterns.

A second example of the invention will be described using FIGS. 9 to 12. In the example, as illustrated in FIG. 9, when measuring the overlapping deviation of a line pattern 901 and a line pattern 903 in the lower layer formed in parallel to the line pattern 901 of the upper layer, $3\sigma_c$ is selected on the screen illustrated in FIG. 6, and by calculating the value, a possible overlapping deviation in the actual pattern can be accurately predicted, hence to perform a pass or fail judgment of a pattern.

The processing flow in the example is basically the same as the processing flow of FIG. 5 having been described in the first example. The processing flow in the example will be described using FIG. 10A.

At first, a target region for calculating an overlapping error between layers is imaged with the SEM (S1001) and this SEM image is recorded in the data recording device 313 (S1002). Next, from the image recorded in the data recording device 313, a target image for calculating the overlapping error is called on the monitor (S1003) and displayed on the monitor 314 (S1004). A schematic view 900 of this image is illustrated in FIG. 9. The size of the view in the horizontal direction is 300 nm and the size in a direction along the line is 2560 nm. Also in the example, the image is binarized similarly to the first example. The corresponding pattern cross sectional structure 910 is illustrated on the top portion for easy understanding. In the example, on the screen 315 of the monitor 314, instead of the image 1011 of FIG. 6 having been described in the first example, the schematic view 900 is displayed.

This pattern is formed by the line pattern 903 made of a first conductive material on a substrate not illustrated, a layer 902 made by depositing an insulating material there so as to cover the line pattern 903, and the line pattern 901 made of a second conductive material formed thereon. Only the vicinity of the edge of a pattern seems white in the SEM image of the line pattern 901 and the SEM image of the line pattern 903 looks white on the whole. In FIG. 9, the lower layer of the line pattern 903 is not illustrated here. The measurement target is a space between the line patterns 901 and 903, and indicated by D in the drawing. When the set value of D is, for example, 55 nm, a difference between the measured value and the design value 55 nm is an overlapping deviation amount at the pattern formation of the pattern upmost layer having the line pattern 901 and the layer having the line pattern 903.

Next, in order to measure the value of D in the analysis region specification step S1005, frames 904 and 905 indicated by a white dotted line as illustrated in FIG. 9 are set on the image 900 displayed on the monitor 314.

Next, in the execution step S1006, a recipe of measuring a distance D between the center of the line patter 901 and the center of the line pattern 903 in the frames 904 and 905 indicated by the white dotted line is executed on the image 900 illustrated in FIG. 9 displayed on the monitor 314. As the result, assume that the value of the obtained D is 59 nm and 51 nm. Further, the same recipe is performed on the same sample at nine positions of the same design, the total of the obtained twenty values is statistically processed, and assume that the average value is 56.2 nm and that the standard deviation of the distribution is 2.5 nm. According to this, it is judged that the overlapping deviation of this time is +1.2 nm and the measurement error (three times of the standard deviation) is 7.5 nm. In the case of this example, since the error is large, measurement by a separate optical device has to be immediately performed separately. As the result, the deviation amount is equal to +1.2 nm and the measurement error is only 0.5 nm.

Figure 10A:
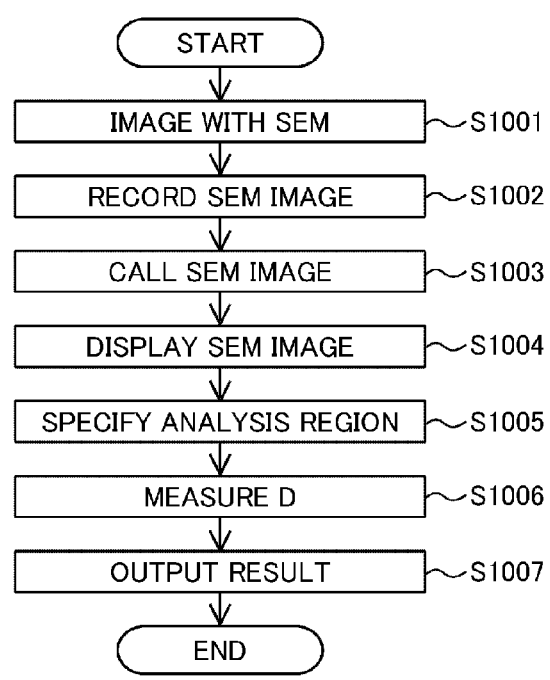
FIG. 10A is a flow chart illustrating the flow of the processing in the second example of the invention.
Figure 10B:
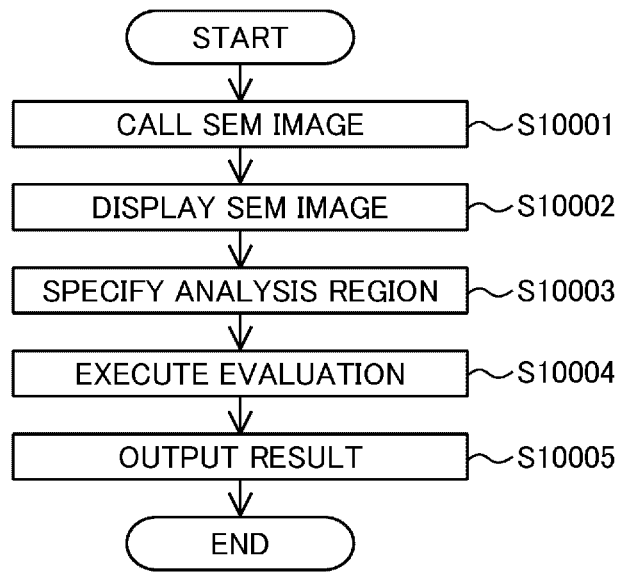
FIG. 10B is a flow chart illustrating the flow of the processing for evaluating the wiggling in the center of the line pattern according to the second example of the invention.

Therefore, the measurement error of the device itself illustrated in FIG. 4 is suspected to be large; further, the image is analyzed as follows, according to the flow of FIG. 10B.

Figure 11:
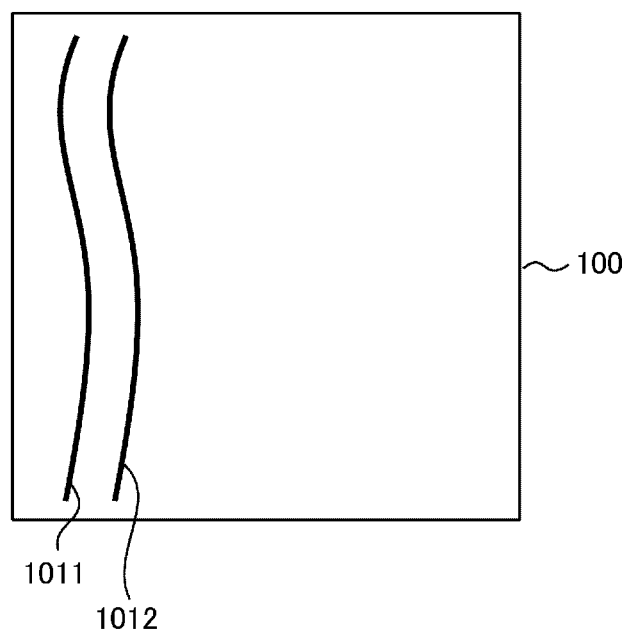
FIG. 11 illustrates the positional data of the edges extracted from the top view image obtained by picking up the line patterns with the SEM according to the second example of the invention.

First, in S1001, the image 900 illustrated in the above FIG. 9 is called and displayed (S10002). Further, in S10003, a region to be analyzed is selected as 906, and the edge of the line pattern in the upmost layer is extracted. The extracted edge is illustrated in FIG. 11. The length of the extracted line edge in the y direction is 2000 nm. Then, in S10005, the expressions 6 and 7 are applied to calculate $\sigma_c^2$ by using the position data of the line left edge 1101 and the position data of the line right edge 1102 illustrated in FIG. 11, and output the result (S10006) thereby finishing the processing. This is similarly applied to the nine positions of the spot images to calculate the $\sigma_c^2$. Then, the average value of the total of ten values is calculated, the square root of the above value is calculated, and multiplied by three ($3\sigma_c$), it becomes 7.2 nm.

This value is very close to the measurement error 7.5 nm initially calculated and it is found that variation of the measured values judged to be error is almost caused by a local positional deviation of the pattern itself by the wiggling. According to this, it is found that there is no problem in the overlapping deviation measurement using the device illustrated in FIG. 4; therefore, the inspection device is continuously used. As the result, a change of the inspection process is unnecessary and therefore, a delay of the production by the replacement of the devices and the generation of the cost can be avoided.

At the same time, such a problem on the process is apparent that the positional deviation in the lower layer occurs because of the wiggling of the pattern and by solving this, the yield is improved.

On the contrary, the average $\sigma_c^2$ is previously measured by the device illustrated in FIG. 4, the square root thereof is subtracted from the allowance value of the original overlapping deviation, which is regarded as an optical overlapping deviation target value β, and then, the overlapping deviation can be evaluated by the optical measurement device. In the evaluation by the optical measurement device, when the resultant value is larger than the optical deviation target value β, the observation target is determined as a fail.

EMBODIMENT 3

A third example of the invention will be hereinafter described using FIGS. 4 and 18. In the example, $\rho_c(m, m+1)$ calculated from a set of the two adjacent lines is calculated for a plurality of line sets and the process that may cause the wiggling is identified from the distribution thereof to take a countermeasure, thereby improving the yield.

At first, an instruction is entered from the computer 312 and fed to the control system 311 of the CD-SEM, and the wafer 307 is moved to the device. The wafer 307 has line patterns of silicon formed by the etching processing. Next, a stage is moved and adjusted so that the line pattern group may come into a view of observation. Next, the lenses 304 and 306 and the deflector 305 are electrically adjusted to obtain a top view image of the patterns according to the signal from the computer 312. The sample image used in this example includes two and more lines. From the edge position data of the line patterns, $\rho_c(m, m+1)$ represented by the expression 9 is calculated. Here, the alphabet m indicates the number of a line. From the image including N lines, N−1 of indicators can be calculated.

Images are taken at twenty positions within the pattern region designed to be formed in the same size and the correlation factor $\rho_c(m, m+1)$ of the center position fluctuation between the lines is calculated, the total of sixty values are obtained. The distribution thereof is made into a histogram, as illustrated in FIG. 12. This graph has two peaks at the position of about 0.1-0.2 in the correlation factor and at the vicinity of 0.7. This means that there are some line sets of strong correlation and other line sets of weak correlation half by half. During the process of forming this pattern, since the SAPD is performed twice, it can be predicted that the LER of the initial pattern may be transferred. Then, the process is reconsidered, and after forming the initial pattern, the LER reduction process is introduced; as the result, the wiggling itself can be reduced to about 0.5 nm and the yield can be improved.

Here, there is also a method of using $\rho_s(m)$, instead of $\rho_c(m, m+1)$. When a random LER caused by the resist material is small, the $\rho_s(m)$ can detect the synchronicity of the wiggling with a higher sensitivity.

Further, there is also a method of using $3\sigma_{LL}(m+1)$, instead of $\rho_c(m, m+1)$. In this case, the component to be synchronized can be represented by the unit of a distance as the fluctuation amount of the line center; therefore, this is suitable for monitoring the degree of the synchronization not only the presence of the synchronization.

REFERENCE SIGNS LIST

301: CD-SEM body,
302: electron gun,
303: electron beam,
304: focusing lens,
305: deflector,
306: objective lens,
307: observation wafer,
308: stage,
309: secondary electron,
310: detector,
311: control system of CD-SEM,
312: data recording device of computer performing an inspection

The invention claimed is:

1. A method of evaluating a shape of a line pattern of a sample in an image obtained by irradiating the sample with a charged particle beam, comprising:
an extraction process of extracting edge points at both sides of a contour of the line pattern;
a fluctuation amount calculation process of calculating a fluctuation amount of the edge points at the both sides, in a direction of extending the line pattern;
a width fluctuation amount calculation process of calculating a fluctuation amount of widths between the edge points at the both sides, in the direction of extending the line pattern; and
a difference calculation process of calculating a difference between the fluctuation amount of the edge points at the both sides and the fluctuation amount of the widths between the edge points at the both sides.

2. The method according to claim 1, further comprising:
a region setting process of setting a specified region including the edge points at the both sides; wherein
the difference calculation process is performed based on an average value of a plurality of edge points or a dispersion value in the specified region.

3. The method according to claim 1, further comprising:
a spectrum calculation process of calculating a first and a second power spectrums that are fluctuation in a direction along the both sides of the contour of the line pattern, wherein
the difference calculation process is performed based on the first and the second power spectrums.

4. A method of evaluating a shape of a line pattern of a sample in an image obtained by irradiating the sample with a charged particle beam, comprising:
an extraction process of extracting edge points at both sides of a contour of the line pattern;
a center point calculation process of calculating a center point of the line pattern based on the edge points at the both sides;
an execution process of executing the extraction process and the center point calculation process a plurality of times, in a direction of extending the line pattern; and
a dispersion value calculation process of calculating a dispersion value of the center points of a plurality of the line patterns calculated in the execution process.

5. The method according to claim 4, further comprising:
an overlapping deviation calculation process of calculating a dispersion value of errors in overlapping deviation measurement, based on a dispersion value of variation of pattern overlapping deviation amount measurement obtained by a charged particle beam device and the above mentioned dispersion value of the center points.

6. A method of evaluating a shape of a line pattern of a sample in an image obtained by irradiating the sample with a charged particle beam, comprising:
an extraction process of extracting edge points of a contour of the line pattern;
a fluctuation amount calculation process of calculating a fluctuation amount of the edge points in a direction along the contour of the line pattern, in a direction of extending the line pattern; and
a similarity calculation process of calculating similarity between the fluctuation amount and a fluctuation amount of edge points of a line pattern adjacent to the above mentioned line pattern.

7. The method according to claim 6, wherein
in the similarity calculation process, similarity between a fluctuation amount of the edge points at a first side of the line pattern and a fluctuation amount of the edge points at a second side different from the first side of the line pattern adjacent to the line pattern, is calculated.

8. The method according to claim 6, further comprising:
a center point calculation process of calculating a center point of the line pattern based on the edge points at the both sides;
an execution process of executing the extraction process and the center point calculation process a plurality of times, in the direction of extending the line pattern;
an adjacent pattern execution process of executing the execution process also in other adjacent line patterns; wherein
in the similarity calculation process, similarity between a fluctuation of the center positions of the line patterns obtained by the execution process and a fluctuation of the center positions of the other adjacent line patterns obtained by the adjacent pattern execution process, is calculated.

9. A method of evaluating a shape of a line pattern of a sample in an image obtained by irradiating the sample with a charged particle beam, comprising:
an extraction process of extracting edge points at both sides of a contour of the line pattern;
a center point calculation process of calculating a center point of the line pattern based on the edge points at the both sides;
an execution process of calculating a fluctuation amount of the center points of the line patterns by several times of execution of the extraction process and the center point calculation process, in a direction of extending the line pattern;
an adjacent pattern execution process of executing the execution process also in other adjacent line patterns; and
a similarity fluctuation amount calculation process of calculating a fluctuation amount that is similar in the line patterns and the other line patterns, based on the fluctuation amount of the center points of the line patterns and the fluctuation amount of the center points of the other line patterns.

10. A device of line pattern shape evaluation comprising:
an image recording unit in which an image obtained by irradiating a sample with a charged particle beam is recorded;
an extraction unit that extracts edge points at both sides of a contour of a line pattern in the image recorded in the image recording unit;
a fluctuation amount calculation unit that calculates a fluctuation amount of the edge points at the both sides, in a direction of extending the line pattern;
a width fluctuation amount calculation unit that calculates a fluctuation amount of widths between the edge points at the both sides, in the direction of extending the line pattern; and
a difference calculation unit that calculates a difference between the fluctuation amount of the edge points at the both sides and the fluctuation amount of the widths between the edge points at the both sides.

11. The device according to claim 10, further comprising
a region setting unit that sets a specified region including the edge points at the both sides, wherein
the difference calculation unit executes a calculation, based on the average value of the edge points or a dispersion value in the specified region.

12. The device according to claim 10, further comprising
a spectrum calculation unit that calculates a first and a second power spectrums that are fluctuation in a direction along the both sides of the contour of the line pattern, wherein the difference calculation unit executes a calculation, based on the first and the second power spectrums.

13. A device of line pattern shape evaluation comprising:
an image recording unit in which an image obtained by irradiating a sample with a charged particle beam is recorded;
an extraction unit that extracts edge points at both sides of a contour of a line pattern in the image recorded in the image recording unit;
a center point calculation unit that calculates a center point of the line pattern based on the edge points at the both sides;
an execution unit that executes the processing by the extraction unit and the center point calculation unit a plurality of times, in a direction of extending the line pattern; and
a dispersion value calculation unit that calculates a dispersion value of the center points of the line patterns calculated by the execution unit.

14. The device according to claim 13, further comprising
an overlapping deviation calculation unit that calculates a dispersion value of errors in overlapping deviation measurement, base on a dispersion value of variation of the pattern overlapping deviation amount measurement obtained by a charged particle beam device and the dispersion value.

15. A device of line pattern shape evaluation comprising:
an image recording unit in which an image obtained by irradiating a sample with charged particle beam is recorded;
an extraction unit that extracts edge points at both sides of a contour of a line pattern in the image recorded in the image recording unit;
a fluctuation amount calculation unit that calculates a fluctuation amount of the edge points in a direction along the contour of the line pattern, in a direction of extending the line pattern; and
a similarity calculation unit that calculates similarity between the fluctuation amount and a fluctuation amount of the edge points in a line pattern adjacent to the line pattern.

16. The device according to claim 15, wherein
the similarity calculation unit calculates similarity between the fluctuation amount of the edge points at a first side of the line pattern and the fluctuation amount of the edge points at a second side different from the first side of the line pattern adjacent to the line pattern.

17. The device according to claim 15, further comprising
a center point calculation unit that calculates a center point of the line pattern based on the edge points at the both sides;
an execution unit that executes the processing by the extraction unit and the center point calculation unit a plurality of times, in the direction of extending the line pattern; and
an adjacent pattern execution unit that executes the processing by the execution unit also in other adjacent line patterns; wherein
the similarity calculation unit that calculates similarity between the fluctuation of the center positions of the line patterns obtained by the execution unit and the fluctuation of the center positions of the other adjacent line patterns obtained by the adjacent pattern execution unit.

18. A device of line pattern shape evaluation comprising:
- an image recording unit in which an image obtained by irradiating a sample with a charged particle beam is recorded;
- an extraction unit that extracts edge points at both sides of a contour of a line pattern in the image recorded in the image recording unit;
- a center point calculation unit that calculates a center point of the line pattern based on the edge points at the both sides;
- an execution unit that calculates a fluctuation amount of the center points of the line patterns by several times of processing by the extraction unit and the center point calculation unit, in a direction of extending the line pattern;
- an adjacent pattern execution unit that executes the processing by the execution unit also in other adjacent line patterns; and
- similarity fluctuation amount calculation unit that calculates a fluctuation amount at a position where the line pattern is similar to the other line pattern, based on the fluctuation amount of the center points of the line patterns and the fluctuation amount of the center points of the other line patterns.

* * * * *